(12) United States Patent
Polyakov et al.

(10) Patent No.: US 12,313,980 B2
(45) Date of Patent: May 27, 2025

(54) INSPECTION SYSTEM, LITHOGRAPHIC APPARATUS, AND INSPECTION METHOD

(71) Applicant: ASML NETHERLANDS B.V., Veldhoven (NL)

(72) Inventors: Alexey Olegovich Polyakov, Veldhoven (NL); Erwin Paul Smakman, Veldhoven (NL); Andrey Nikipelov, Veldhoven (NL); Albertus Victor Gerardus Mangnus, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 169 days.

(21) Appl. No.: 16/977,503

(22) PCT Filed: Feb. 25, 2019

(86) PCT No.: PCT/EP2019/054630
§ 371 (c)(1),
(2) Date: Sep. 2, 2020

(87) PCT Pub. No.: WO2019/174899
PCT Pub. Date: Sep. 19, 2019

(65) Prior Publication Data
US 2021/0055660 A1 Feb. 25, 2021

(30) Foreign Application Priority Data
Mar. 16, 2018 (EP) .................................. 18162351

(51) Int. Cl.
*G03F 7/00* (2006.01)
*G01N 23/2251* (2018.01)
*H01L 21/67* (2006.01)

(52) U.S. Cl.
CPC ....... *G03F 7/7065* (2013.01); *G01N 23/2251* (2013.01); *G03F 7/70808* (2013.01);
(Continued)

(58) Field of Classification Search
CPC .. G03F 7/7065; G03F 7/7085; G03F 7/70808; G03F 7/70691; G03F 7/70733;
(Continued)

(56) References Cited

U.S. PATENT DOCUMENTS 6,251,693 B1 * 6/2001 Nuttall .................... H01L 22/24
257/E21.527
7,386,162 B1   6/2008 Dakshina-Murthy et al.
(Continued)

FOREIGN PATENT DOCUMENTS

| CN | 106024660 | 10/2016 |
|----|-----------|---------|
| CN | 107799451 | 3/2018  |

(Continued)

OTHER PUBLICATIONS

Taiwanese Office Action issued in corresponding Taiwanese Patent Application No. 108108569, dated Mar. 22, 2021.
(Continued)

Primary Examiner — Christina A Riddle
(74) Attorney, Agent, or Firm — Pillsbury Winthrop Shaw Pittman, LLP

(57) ABSTRACT

An inspection system that include a selective deposition tool configured to receive a sample and selectively deposit a material onto the sample, an inspection tool configured to perform an inspection process on the sample provided with the deposited material, and an enclosure configured to enclose the selective deposition tool and the inspection tool.

20 Claims, 12 Drawing Sheets

(52) U.S. Cl.
CPC ...... *G03F 7/7085* (2013.01); *H01L 21/67213* (2013.01); *H01L 21/67288* (2013.01)

(58) Field of Classification Search
CPC .... G03F 7/7075; G03F 7/708; G03F 7/70841; G03F 7/70858; G03F 7/70866; G03F 7/70875; G03F 7/70908; G03F 7/70916; G03F 7/70975; G03F 7/70991; G01N 23/2251; H01L 21/67288; H01L 21/67173; H01L 21/67207; H01L 21/67213; H01L 21/67155–6723; H01L 21/67242; H01L 21/67253; H01L 21/0226; H01L 21/02263; H01L 21/02266; H01L 21/02271–0228
USPC ....... 355/18, 30, 52–55, 67–71, 72–77, 133; 250/307, 492.1, 492.2, 492.21, 492.3; 118/712, 715, 719, 708, 50, 50.1, 500; 118/503, 733; 414/217, 935, 221, 937, 414/941
See application file for complete search history.

(56) References Cited

U.S. PATENT DOCUMENTS

| | | | |
|---|---|---|---|
| 9,287,183 B1 | 3/2016 | Zhao et al. | |
| 2003/0084918 A1 | 5/2003 | Kim | |
| 2004/0007325 A1 | 1/2004 | Pan et al. | |
| 2007/0134821 A1* | 6/2007 | Thakur | C23C 16/481 438/5 |
| 2007/0196011 A1* | 8/2007 | Cox | H01L 21/67109 382/145 |
| 2009/0081827 A1* | 3/2009 | Yang | H01L 21/3141 257/E21.336 |
| 2015/0007858 A1* | 1/2015 | Matsuo | H01L 21/02046 134/18 |
| 2015/0179487 A1* | 6/2015 | Chen | C23C 16/45544 438/761 |
| 2016/0111307 A1* | 4/2016 | Davis | H01L 22/24 156/345.24 |
| 2019/0295870 A1* | 9/2019 | Tapily | H01L 21/67207 |

FOREIGN PATENT DOCUMENTS

| | | |
|---|---|---|
| JP | 2002261146 | 9/2002 |
| JP | 2017198657 | 11/2017 |
| JP | 2017214654 | 12/2017 |
| JP | 2018041080 | 3/2018 |
| TW | 438903 | 6/2001 |

OTHER PUBLICATIONS

Japanese Office Action issued in corresponding Japanese Patent Application No. 2020-545673, dated Nov. 30, 2021.
International Search Report and Written Opinion issued in corresponding PCT Patent Application No. PCT/EP2019/054630, dated Apr. 15, 2019.
Office Action issued in corresponding Chinese Patent Application No. 201980019656, dated Jul. 8, 2024.

* cited by examiner

INSPECTION SYSTEM, LITHOGRAPHIC APPARATUS, AND INSPECTION METHOD

CROSS-REFERENCE TO RELATED APPLICATIONS

This application is the U.S. national phase entry of PCT Patent Application No. PCT/EP2019/054630, which was filed on Feb. 25, 2019, which claims the benefit of priority of European Patent Application No. 18162351.3, which was filed on Mar. 16, 2018, and which is incorporated herein in its entirety by reference.

BACKGROUND

Field of the Invention

The present invention relates to an inspection system, an inspection method and a lithographic apparatus.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The radiation beam as typically applied in lithographic apparatuses may e.g. be a DUV radiation beam (e.g. having a wavelength of 248 nm or 193 nm) or an EUV radiation beam (e.g. having a wavelength of 11 nm or 13.5 nm).

The manufacturing of an integrated circuit may typically require the stacking of a plurality of layers, whereby the layers need to be accurately aligned. Without such an alignment, a required connection between layers may be flawed, resulting in a malfunctioning of the integrated circuit.

Typically, the bottom layer or layers of the integrated circuit will contain the smallest structures, such as transistors or components thereof. The structures of subsequent layers are typically larger and enable connections of the structures in the bottom layers to the outside world. In view of this, an alignment of two layers will be the most challenging in the bottom portion of the integrated circuit.

In order to ensure that a circuit or a circuit layer is properly patterned, substrates are often subjected to inspection, using inspection tools such as e-beam inspection tools. Such tools may e.g. be applied to assess whether or not certain process steps, as. e.g. performed by a lithographic apparatus, are executed as expected.

It would be desirable to improve the performance of inspection tools such as e-beam based inspection tools or the like.

SUMMARY

It is desirable to improve the performance of e-beam inspection tools, in particular, it would be desirable to obtain a more detailed feedback on the performance of lithographical apparatuses or processes, based on measurements performed by inspection tools such as e-beam inspection tools. In order to address these concerns, according to an aspect of the present invention, there is provided an inspection system comprising:
  a selective deposition tool configured to:
    receive a sample;
    selectively deposit a material onto the sample;
  an inspection tool configured to:
    perform an inspection process on the sample provided with the deposited material,
  an enclosure configured to enclose the selective deposition tool and the inspection tool.

According to another aspect of the present invention, there is provided an inspection method using an inspection system according to any of the preceding claims, the method comprising:
  receiving a sample by the inspection system;
  selectively depositing a material onto the sample using the selective deposition tool;
  inspecting the sample onto which the material is deposited using the inspection tool.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
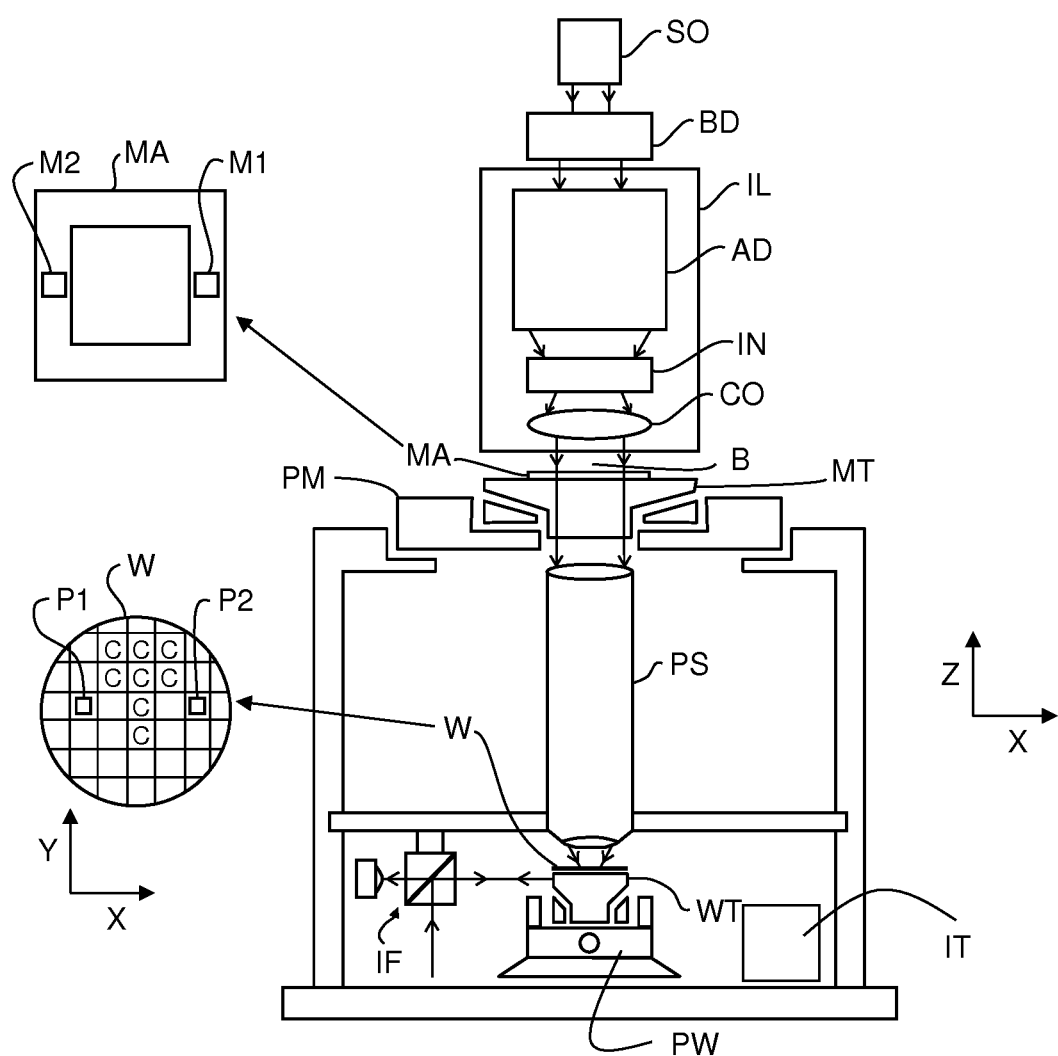
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g.

a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask)

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support"

may be realized using a long-stroke module and a short-stroke module, which form part of the second positioning device PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.
2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In the embodiment as shown, the lithographic apparatus further comprises an inspection system IT according to the invention. Such an inspection system IT may e.g. enable to determine a characteristic of a structure e.g. a buried structure that is present on or in an area of interest of a substrate W that is processed by the lithographic apparatus. In an embodiment, as will be discussed in more detail below, the inspection system may comprise an electron beam source for inspecting the substrate.

In an embodiment, the second positioning device PW may be configured to position the substrate W in the operating range of the inspection tool IT. In such an embodiment, the inspection tool IT may e.g. be configured to determine a characteristic of the mentioned structure, e.g. an electric characteristic, a material characteristic and/or a geometric characteristic. In an embodiment, this information may subsequently be provided to a control unit of the lithographic apparatus and used during the exposure process, e.g. by controlling one or more of the illumination system, the projection system or one of the positioning devices, based on the information.

In the embodiment as shown, the lithographic apparatus may be configured to apply DUV radiation for the radiation beam. In such case, the patterning device MA may be a transmissive patterning device and the projection system PS may comprise one or more lenses.

Alternatively, the lithographic apparatus according to the present invention may be configured to apply EUV radiation for the radiation beam. In such case, the patterning device MA may be a reflective patterning device and the projection system PS may comprise one or more mirrors. In such embodiment, the apparatus may comprise one or more vacuum chambers for housing the illumination system IL and/or the projection system PS.

In accordance with an aspect of the present invention, the lithographic apparatus may comprise an inspection system according to the present invention, in order to perform an inline or offline inspection of a substrate that is to be processed or has been processed.

In accordance with an aspect of the present invention, a lithographic system is provided comprising a lithographic apparatus and an inspection system according to the invention. In such an arrangement, the inspection system may be an offline inspection system, which may also be referred to as a standalone tool.

According to an aspect of the invention, there is provided an inspection system configured to inspect an object such as a semiconductor substrate.

In accordance with the present invention, an inspection system comprises a selective deposition tool such as an atomic layer deposition (ALD) tool and an e-beam inspection tool. In accordance with the present invention, the selective deposition tool and the e-beam inspection tool are arranged in an enclosure. By doing so, an improved control of the overall inspection process can be realized. In an embodiment, the enclosure can be a common enclosure.

The inspection system according to the present invention may advantageously be used to enhance the performance of the e-beam inspection tool of the inspection system. By combining the e-beam inspection tool with a selective deposition tool, an improved imaging of areas of interest can be obtained when a sample that has been processed by the selective deposition tool is inspected by the e-beam inspection tool. By integrating both tools, e.g. arranging both tools in a common enclosure, the overall time to inspect a sample may be reduced. In addition, adverse effects of transferring a sample from a stand-alone selective deposition tool to a stand-along e-beam inspection tool can be avoided. In particular, by arranging both tools in a common enclosure, one may, in an embodiment of the present invention, maintain a conditioned atmosphere inside the common enclosure, such that adverse temperature or contamination effects during the transfer of the sample can be mitigated or avoided. Such adverse effects may also be oxidation, water absorption or other detrimental chemical conversion processes.

Alternatively, the enclosure of the inspection system may comprise a first chamber enclosing the selective deposition tool and a second chamber enclosing the inspection tool, whereby the inspection system further comprises a sample transfer system for transferring the sample from a location within the first chamber to a location within the second chamber.

Figure 2:
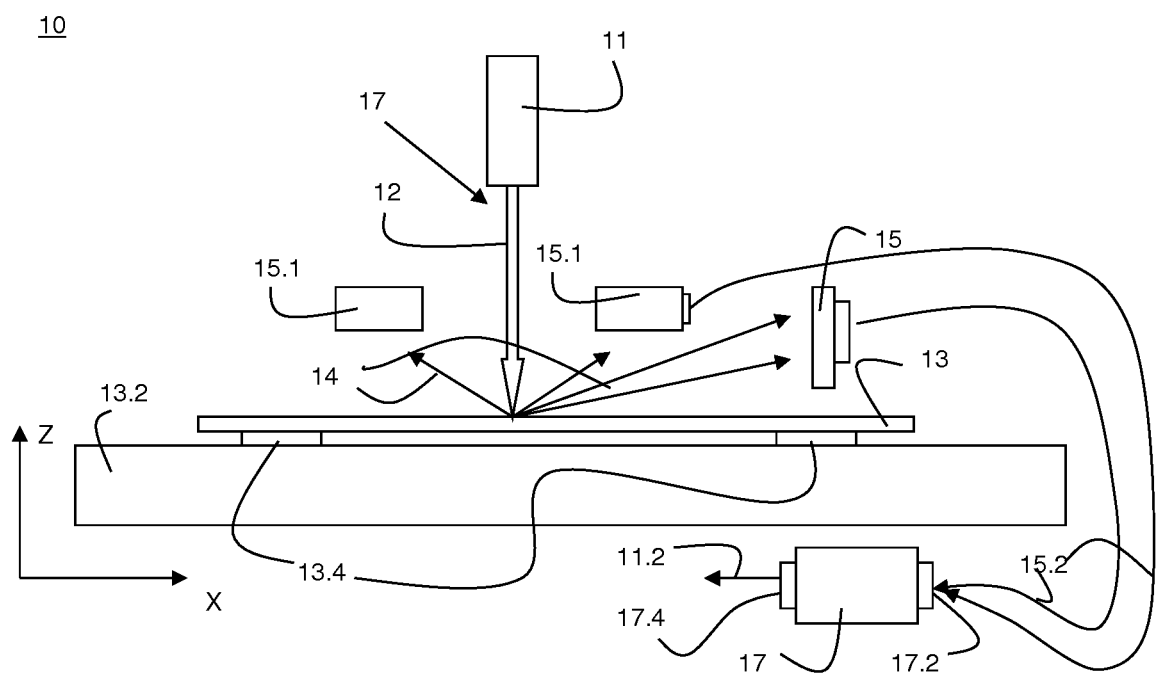
FIG. 2 depicts an inspection tool according to an embodiment of the invention.

FIG. 2 schematically shows an embodiment of an inspection tool 10 as can be applied in an inspection system according to the present invention. in the embodiment as shown, the inspection tool 10 comprises an electron beam source 11, further on also referred to as an e-beam source 11. Such an e-beam source 11 is known in general, and may be applied in the present invention to project an electron beam 12 onto an area of an object or sample 13, e.g. a semiconductor substrate that needs to be inspected. In the embodiment as shown, the object 13 is mounted to an object table 13.2 by means of a clamping mechanism 13.4, e.g. a vacuum clamp or an electrostatic clamp. The area of the object onto which the e-beam is projected may also be referred to as sample. Such an e-beam source 11 may e.g. be used to generate an electron beam 12 having an energy ranging from 0.2 keV to 100 keV. An e-beam source 11 may typically have one or more lenses for focusing the electron beam 12 onto a spot of about 0.4 to 5 nm in diameter. In an embodiment, the e-beam source 11 may further comprise one or more scanning coils or deflector plates which may deflect the electron beam 12. By doing so, the electron beam 12 may e.g. be deflected along an X-axis and an Y-axis (perpendicular to the X-axis and the Z-axis), the XY-plane being parallel to a surface of the object, such that an area of the object can be scanned.

In an embodiment of the present invention, the electron beam source is configured to project a plurality of electron beams onto a respective plurality of sub-areas of the area of interest. By doing so, the area of interest that can be examined or inspected per unit of time may be enlarged. Further, in an embodiment of the present invention, the electron beam source may be configured to generate electron beams having a different energy level. Depending on the applied energy level for the e-beam or beams, different portions or a structure, e.g. a buried structure, may be examined. When such an e-beam 12 impinges on the surface, interactions on the surface and interactions with the material below the surface will occur, resulting in the exposed surface emitting both radiation and electrons. Typically, when an electron beam 12 interacts with a sample, the electrons constituting the beam will loose energy through scattering and absorption, within a teardrop-shaped volume, known as the interaction volume. The energy exchange between the electron beam and the sample will typically result in a combination of:
- an emission of secondary electrons by inelastic scattering,
- an emission of electrons that are reflected or back-scattered out of the interaction volume by elastic scattering interactions with the sample,
- X-ray emission, and
- an emission of electromagnetic radiation, e.g. in a range from deep UV to IR.

The latter emission of electromagnetic radiation is generally referred to as cathodoluminescent light or CL-light.

In an embodiment of the present invention, the inspection tool 10 further comprises a detector 15 for detection of secondary electrons and a detector 15.1 for back-scattering electrons as emitted by a sample. In FIG. 2, the arrows 14 are indicative for the emitted secondary or back-scattering electrons.

In the embodiment as shown, the inspection tool further comprises a control unit 17 or processing unit, e.g. comprising a microprocessor, computer or the like, for processing the emitted secondary or back-scattering electrons as detected by the detectors 15 and 15.1.

In an embodiment, the control unit 17 comprises an input terminal 17.2 for receiving signals 15.2 from the detectors 15, 15.1, the signals 15.2 representing the detected emitted secondary or back-scattering electrons.

In an embodiment, the control unit may further have an output terminal 17.4 for outputting a control signal 11.2 for controlling the e-beam source 11. In an embodiment, the control unit 17 may control the e-beam source 11 to project an e-beam 12 onto an area of interest of the object to be inspected, e.g. a semiconductor substrate.

In an embodiment, the control unit 17 may be configured to control the e-beam source 11 to scan the area of interest.

During such scanning of an area of interest of an object, the detector may receive secondary or back-scattering electrons 14 from different portions of the area of interest. As an example, the applied e-beam may e.g. have a cross-section of 1-4 nm in diameter, while the area of interest is 100 nm×100 nm. As such, when the area of interest has been scanned, a response to the e-beam across the area of interest may have been captured by detectors 15, 15.1, where the detected signal is comprised of detected electrons per illuminated pixel. The pixel size may be e.g. be smaller or larger than the cross-section of the e-beam.

Figure 3A:
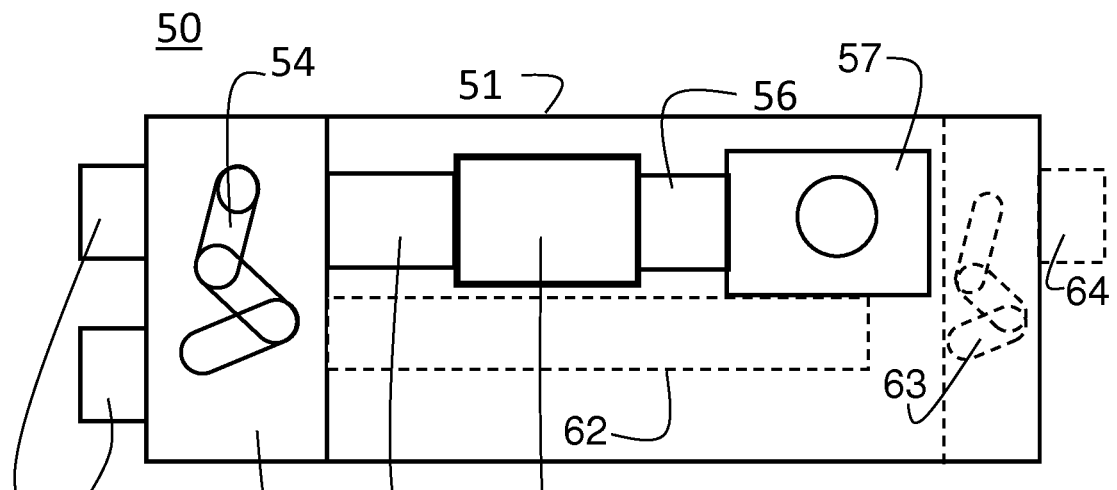
FIGS. 3a and 3b schematically depicts a top view and a side view of an inspection system according to the present invention.
Figure 3B:
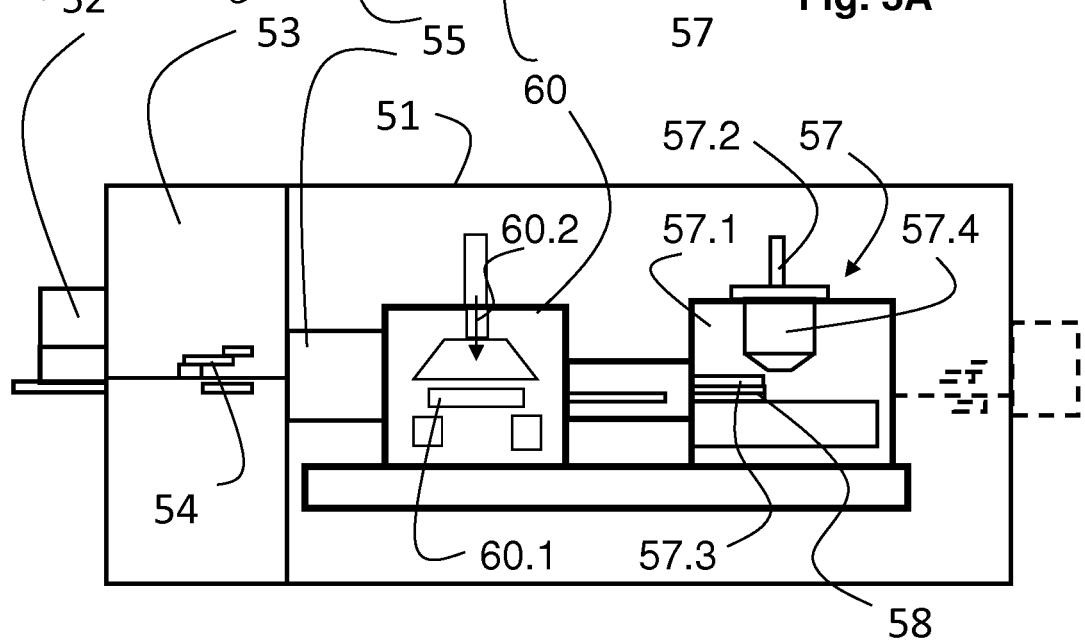

FIGS. 3A and 3B schematically depict a top view and a cross-sectional view of an inspection system 50 according to an embodiment of the present invention. The embodiment as shown comprises an enclosure 51, a pair of load ports 52 serving as an interface to receive objects to be examined and to output objects that have been examined. The embodiment as shown further comprises an object transfer system 53, that is configured to handle and/or transport the objects to and from the load ports. In the embodiment as shown, the object transfer system 53 comprises a handler robot 54 configured to transport objects between the load ports and a load lock 55 of the inspection system 50. The load lock 55 is an interface between atmospheric conditions occurring outside the enclosure 51 and the conditions inside a selective deposition tool 60 of the inspection system 50. In an embodiment, such a selective deposition tool 60 may e.g. be an atomic layer deposition tool or a chemical layer deposition tool whereby, e.g. by means of a plasma and use of a precursor, a layer of a particular material is selectively deposited on a sample. In the embodiment as shown, a sample 60.1 may be subjected to a plasma 60.2, thereby depositing a material onto the sample 60.1.

In an embodiment, the selective deposition tool 60 may also comprise a combination of multiple deposition tools. Using such a tool, the generation of a selective deposition, e.g. a selective coating, may be the result of a sequential deposition process, optionally also involving etching steps. In such embodiment, at least one of these deposition processes may involve a gas or liquid based atomic layer deposition (ALD) or molecular layer deposition (MLD). Such an ALD or MLD step may e.g. be followed by one or more CVD or PVD (physical vapor deposition) steps, e.g. to allow a development or tuning or particular properties of the selectively deposited material, e.g. the deposited coating. Such properties may e.g. include electric conductivity, material composition, thickness, density, etc.

In the embodiment as shown, the inspection system 50 further comprises a second load lock 56, serving as an interface between the selective deposition tool 60 and an inspection tool 57, e.g. an e-beam inspection tool. In an embodiment, such a load lock 56 may be part of a transfer system for transferring a sample from the selective deposition tool 60 to the inspection tool 57. Typically, in case of an electron beam inspection tool, an inspection will occur under vacuum conditions. As such, in an embodiment of the present invention, the inspection tool 57 comprises a vacuum chamber 57.1 enclosing an electron beam source 57.2 configured to generate an electron beam. In the embodiment as shown, the vacuum chamber 56 further comprises an electron optics system 57.4 configured to project an e-beam onto an object 57.3 to be inspected, e.g. a semiconductor substrate or wafer. The e-beam inspection tool 57 further comprises a positioning device 58 that is configured to displace the object 57.3 relative to the e-beam generated by the electron optics system 57.4.

In an embodiment, the positioning device may comprise a cascaded arrangement of multiple positioners such an XY-stage for positioning the object in a substantially horizontal plane, and a Z-stage for positioning the object in the vertical direction.

In an embodiment, the positioning device may comprise a combination of a coarse positioner, configured to provide a coarse positioning of the object over comparatively large distances and a fine positioner, configured to provide a fine positioning of the object over comparatively small distances.

In an embodiment, the positioning device 58 further comprises an object table for holding the object during the inspection process performed by the inspection tool 57. In such embodiment, the object may be clamped onto the object table by means of a clamp such as an electrostatic clamp. Such a clamp may be integrated in the object table.

Once the object or sample has been inspected by the inspection tool 57, the object or sample can be transferred back to the handler robot 54, e.g. via a transfer path 62 In an embodiment, such a transfer path may include a load lock, e.g. configured to bring the sample from a first conditioned atmosphere (e.g. a high vacuum atmosphere) to a second conditioned atmosphere (e.g. atmospheric or low vacuum conditions). The object or sample may subsequently be outputted via port 52 by the handler robot 54. Alternatively, a second handler robot 63 may be provided to receive the object that has been inspection by the inspection tool 57, the robot 63 being configured to output the object via an output port 64.

As will be understood by the skilled person, the particular arrangement of a selective deposition tool (SDT) and an e-beam inspection tool (EIT) inside a common disclosure is only one of many options.

Figure 4:
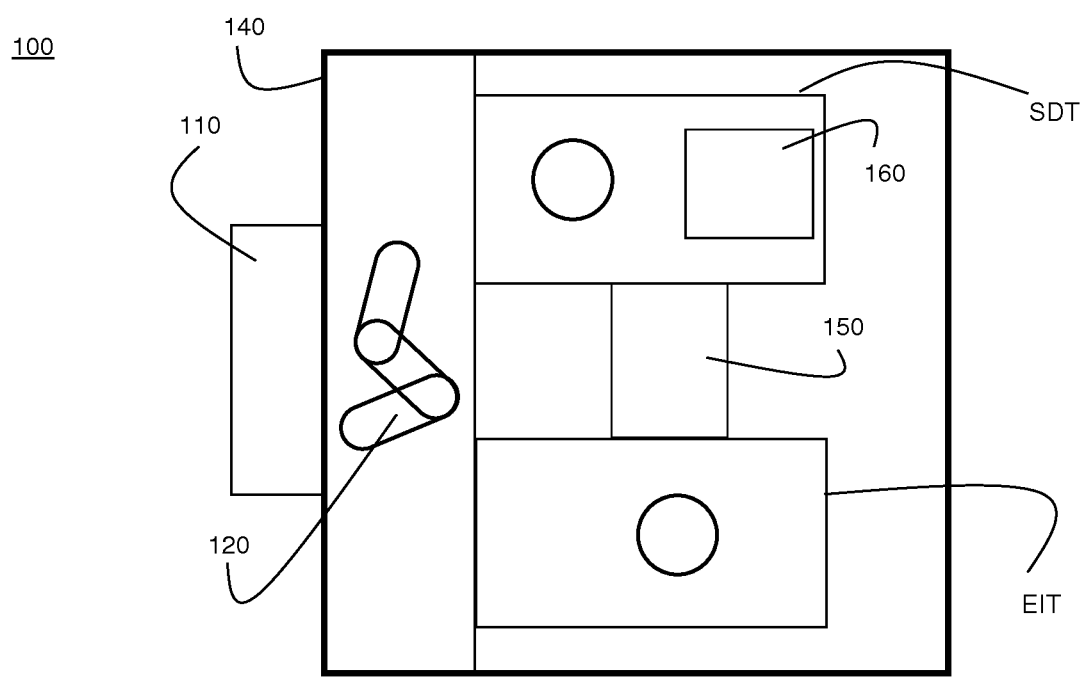
FIG. 4 schematically depicts a top view of an inspection system according to the present invention.

FIG. 4 schematically depicts a top view of an inspection system according to the present invention that has a different layout. The inspection system 100 comprises a load port 110 for receiving and outputting samples or substrates that need processing by the inspection system. The inspection system 100 further comprises a handling system 120 for handling the sample or substrate, such handling e.g. involving transporting the sample or substrate from the load port to a selective deposition tool (SDT) and/or an e-beam inspection tool (EIT) of the inspection system 100. In the embodiment as shown, both the selective deposition tool (SDT) and the e-beam inspection tool (EIT) are arranged inside a common enclosure 140 of the inspection system 100. In the embodiment as shown, a load lock 150 is provided for transferring the sample or substrate from the SDT to the EIT. In the embodiment as shown, the SDT is provided with a washing unit or material removal unit 160. Such a unit may e.g. be applied by the SDT for removing deposited materials as part of the selective deposition process. This will be discussed in more detail below.

In an alternative embodiment the inspection system 100 may comprise a further washing unit (not shown), e.g. arranged near the handling system. In an alternative embodiment, the inspection system comprises a washing system (not shown) that may be applied to remove the deposited materials after inspection of the sample or substrate by the EIT. Note that this functionality may also be fulfilled by the washing unit or material removal unit 160. In such arrangement, the inspection system 100 may be configured to transfer a sample or substrate that has been inspected by the EIT back to the SDT to have the deposited material removed.

In an embodiment, the inspection system 100 may further comprise additional processing or conditioning tools such as etching tools (not shown) or bake out tools.

By arranging the SDT and EIT inside a common enclosure 140, transportation and handling of the sample or substrate can be kept to a minimum. By doing so, any disturbances, e.g. thermal or mechanical disturbances, that could occur during the transport of a sample or substrate from a stand-alone selective deposition tool to a stand-alone electron beam inspection tool can be avoided or mitigated.

In an embodiment of the present invention the SDT and the EIT are mounted to a common base or base frame.

In an embodiment, the SDT and the EIT are mounted on a ground floor of the common enclosure.

In an embodiment, the SDT and the EIT are mounted to a common isolated frame, mounted to a base frame or ground floor of the common enclosure. In such embodiment, the common isolated frame may be supported by one or more vibration isolators.

In an alternative embodiment, each of the SDT and the EIT is mounted to a separate, dedicated isolated frame, each frame being isolated from a base frame or ground floor by means of one or more vibration isolators. By doing so, mechanical operations such as handling, transporting or displacing of a sample or substrate inside one of the tools will not affect or cause vibrations in the other tool. By doing so, a simultaneous processing of samples or substrates in both tools can be realized.

In an embodiment, the EIT is mounted to a separate isolated frame, e.g. a frame that is isolated from a base frame or ground floor by means of one or more vibration isolators. In this respect, it can be pointed out that typically the inspection tool as applied in the inspection system according to the present invention may be most susceptible to disturbances. Due to this, care should be taken in case multiple samples are processed by the inspection system in parallel. As will be understood by the skilled person, one could in principle process a sample in the SDT, while another sample is processed in the EIT. Using such an approach, care needs to be taken to avoid disturbances. In particular, a processing sequence of a sample may be such that the sample is not transported, moved or transferred while another sample is being inspected by the inspection tool EIT. As an example, a processing sequence may thus include the transporting of a sample to an object table of the SDT, wait for disturbances/vibrations to be diminished and then inspect another sample using the inspection tool EIT. it may be pointed out that the deposition process on a sample, or certain steps of the deposition process may be performed in parallel to the inspection process performed on another sample.

In an embodiment, the common enclosure 140 comprises a magnetic shielding enclosing both the SDT and the EIT and any transfer or handling system for transferring samples or substrates from the SDT to the EIT. So, electromagnetic disturbances can be mitigated, also during transfer.

In a preferred embodiment, the inspection tool EIT is provided with a dedicated electromagnetic shielding, so as to avoid disturbances caused by handling systems or transfer systems outside the inspection tool.

The inspection system according to the present invention may advantageously be applied for inspecting semiconductor substrates, also referred to as samples, which have been subjected to one or more processes, such as lithographic exposure processes.

Typically, such samples are examined or inspected using e-beam inspection tools such as scanning electron microscopes (SEM), low energy electron microscopes (LEEM) or spin-polarized low energy electron microscopes (SPLEEM). By probing a sample with an electron beam and observing, i.e. detecting a response to said probing, information about the sample can be obtained. Said information may e.g. include geometric or topographic information about the sample or material characteristics. Said information may relate to characteristics of the surface or the top layer as provided on a sample, but it may also relate to characteristics of buried structures or patterned or structured layer that are present underneath the surface of the sample.

As conditions with respect to accuracy for semiconductor processes become more stringent, the accuracy at which these processes can be evaluated should be enhanced as well. The inspection of a semiconductor substrate or sample using an e-beam inspection tool may sometimes be difficult, e.g. due to a poor signal to noise ratio or due to a poor contrast. In particular, it may be difficult, using a conventional e-beam inspection tool to accurately assess the quality of structures such as lines, holes, cuts, vias or logic devices that are e.g. 2-10 nm apart, due to a low contrast obtained between the different materials used.

In order to enable a more accurate assessment of processes performed on semiconductor samples, it is proposed to combine an e-beam inspection tool and a selective deposition tool into an inspection system.

In particular, using such a system, a semiconductor substrate or sample may, in a first step, be processed by the selective deposition tool. During said first step, a material is selectively deposited onto an area of interest of the sample.

In accordance with the present invention, various types of selective deposition tools may be suited to be applied in the inspection system. Examples of such selective deposition tools are CVD (chemical vapor deposition) tools and ALD (atomic layer deposition) tools.

Such selective deposition tools generally apply chemical techniques for selectively depositing materials on a substrate. Within the meaning of the present invention, a selective deposition of a material on a sample refers to the process of covering particular areas or surfaces of the sample with the material, whereas other areas or surfaces are substantially left uncovered by the material.

Figure 5:
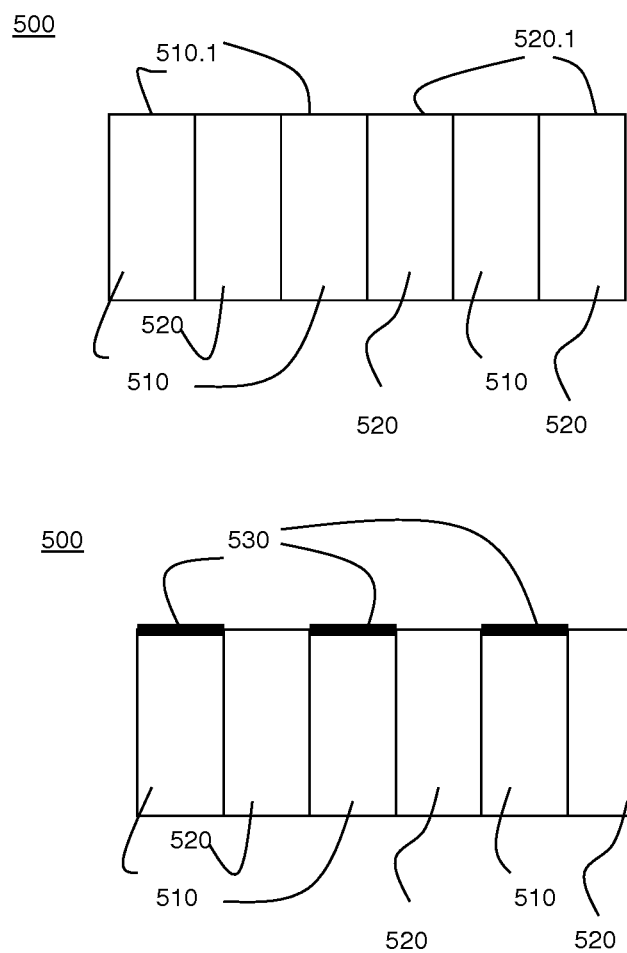
FIGS. 5-8 schematically depict selective deposition processes as can be applied by selective deposition tools of the inspection system according to the present invention.

In an embodiment of the present invention, the selectivity of the selective deposition process, may be referred to as a material based selectivity. In such embodiment, whether or not the applied material to be deposited is actually deposited on a particular area or surface depends on the material characteristic of said surface. This is schematically illustrated in FIG. 5. The top portion of FIG. 5 schematically shows a cross-sectional view of a structure 500 comprising materials 510 and 520, the upper surface of the structure thus having areas or surfaces where either the material 510 is exposed (surface 510.1) or the material 520.1. A material base selective deposition refers to a process whereby the deposition depends on the material of the exposed surface. As schematically illustrated in the bottom portion of FIG. 5, a material based selective deposition may e.g. result in a deposition of a material layer 530 onto the exposed surfaces 510.1 of the material 510, whereas substantially no deposition takes place on the exposed surface 520.1 of the material 520.

Alternatively, a material based selective deposition may e.g. result in a deposition of a material layer onto the exposed surfaces 510.1 of the material 510, whereas substantially no deposition takes place on the exposed surface 520.1 of the material 520.

In an embodiment of the present invention, such a material based selective deposition of a material onto a sample may be used to increase or decrease the visibility or detectability of certain area's or structure or materials of the sample. As an example, by covering certain areas or surfaces with a material that can be characterized as an electrical insulator, areas of the sample that are covered with this material will be obscured or less visible. As a result, the visibility, e.g. characterized by the contrast, of the areas or surfaces that are not covered may be improved, when the sample is e.g. subjected to an inspection process using an electron beam.

Figure 6:
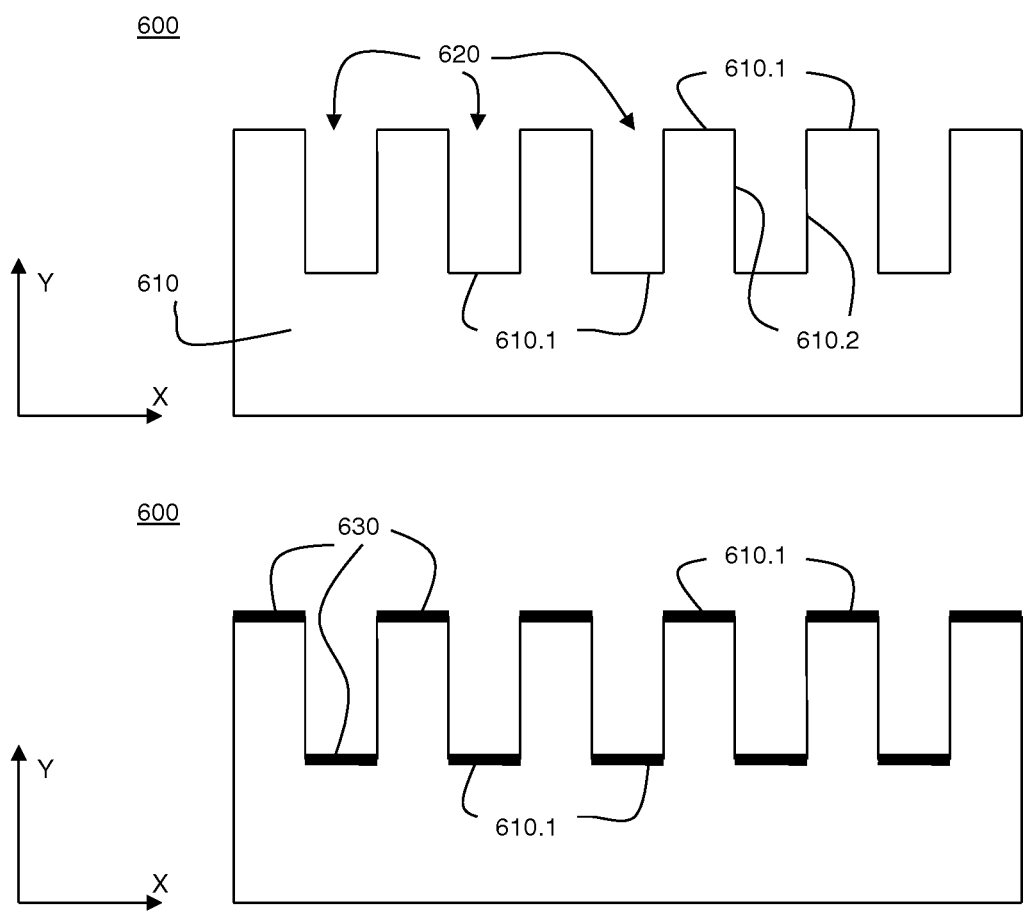

In an embodiment of the present invention, the selectivity of the selective deposition process, may be referred to as a topography based selectivity. In such embodiment, whether or not the applied material to be deposited is actually deposited on a particular area or surface of a sample depends on a topographic characteristic of the surface. This is schematically illustrated in FIG. 6. The top portion of FIG. 6 schematically shows a cross-sectional view of a structure 600 made of a material 610 and comprising a plurality of holes or trenches 620. Topographically, one can thus identify two types of surfaces in the structure. In particular, surfaces 610.1 extending in the X-direction, e.g. a direction in the horizontal plane, and surfaces 610.2 extending in the Y-direction, i.e. surfaces along the vertical direction. A topography based selective deposition refers to a process whereby the deposition depends on the topography of the exposed surface. As schematically illustrated in the bottom portion of FIG. 6, a topography based selective deposition may e.g. result in a deposition of a material layer 630 onto the exposed surfaces 610.1 of the material 610, whereas substantially no deposition takes place on the exposed surface 610.2 of the material 610. Alternatively, a topography based selective deposition may e.g. result in a deposition of a material layer onto the exposed surfaces 610.2 of the material 610, i.e. the vertically oriented surfaces, whereas substantially no deposition takes place on the exposed surface 610.1 of the material 610.

In an embodiment of the present invention, such a topography based selective deposition of a material onto a sample may be used to increase or decrease the visibility or detectability of certain area's or structures of the sample that have a particular topography. As an example, by covering certain areas or surfaces with a material that can be characterized as an electrical insulator, areas of the sample that are covered with this material will be obscured or less visible. As a result, the visibility, e.g. characterized by the contrast, of the areas or surfaces that are not covered may be improved, i.e. highlighted, when the sample is e.g. subjected to an inspection process using an electron beam.

In an embodiment of the present invention, the material as applied to selectively cover certain areas or surfaces of a sample is characterized as an electrical conductor. By doing so, the visibility, e.g. characterized by the contrast, of the areas or surfaces that are covered by this material may be improved, i.e. highlighted, when the sample is e.g. subjected to an inspection process using an electron beam.

The selective deposition process as illustrated in FIGS. 5 and 6 apply one deposition step, whereby particular areas or surfaces of a sample are covered or not covered by the deposited material.

In an embodiment of the present invention, the selective deposition process as applied by the selective deposition tool of the inspection system comprises two deposition steps. Such an embodiment is schematically illustrated in FIG. 7.

Figure 7:
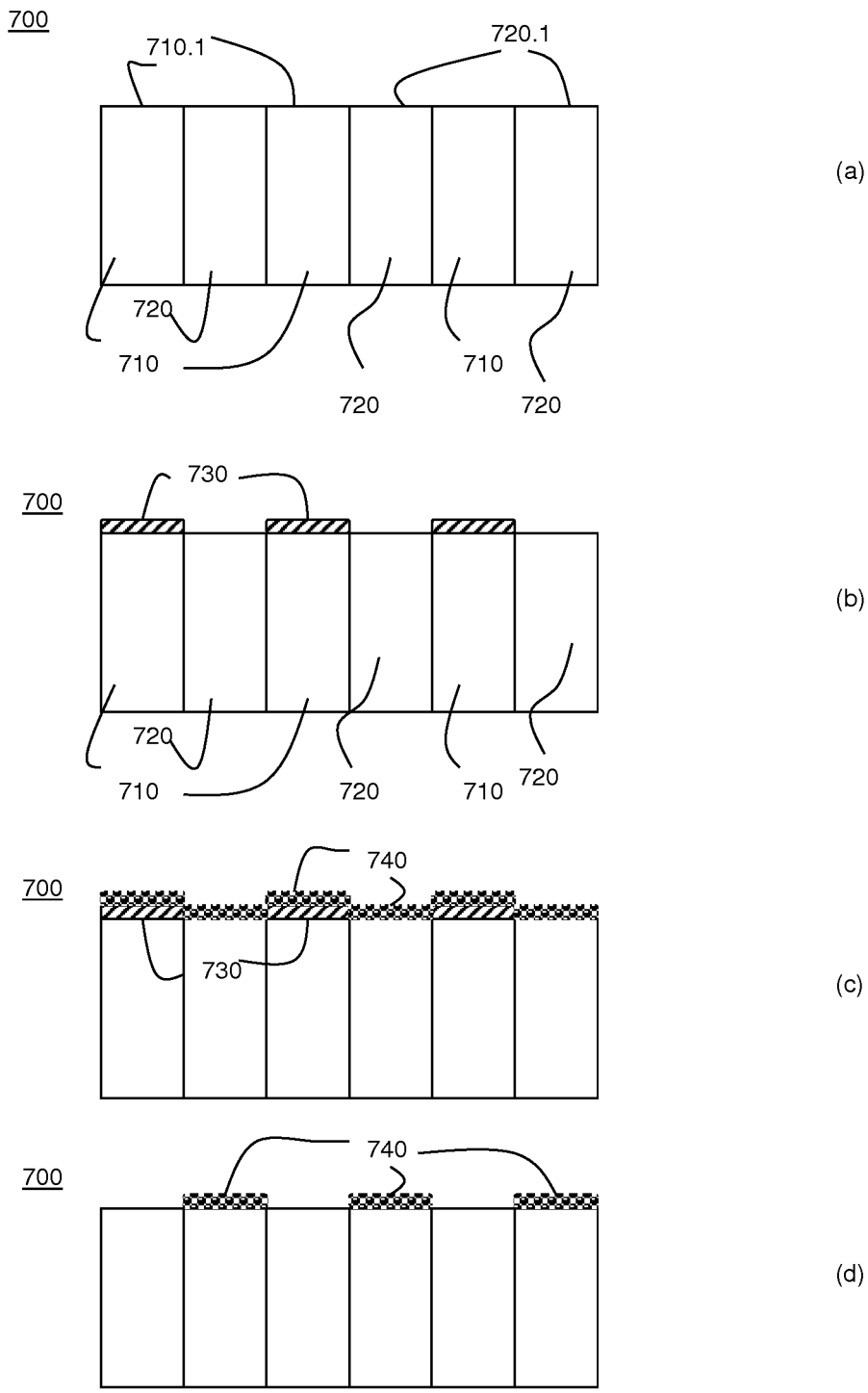

The portion (a) of FIG. 7 schematically shows a cross-section view of a structure 700 comprising materials 710 and 720, the upper surface of the structure thus having areas or surfaces where either the material 710 is exposed (surface 710.1) or the material 720 (surface 720.2).

The portion (b) of FIG. 7 schematically shows the result of a first, material based, selective deposition process whereby a material 730 is deposited, only on the surfaces 710.1 of the material 710. In the two deposition steps process, this step may e.g. be referred to as an area activation or area de-activation step, whereby selected areas or surfaces are rendered attractive or repulsive for the deposition of particular materials or molecules. Usually this property of surfaces or molecules is defined by the polarity and bonds that available on the surface.

In a second deposition step, illustrated in portion (c) of FIG. 7, a second material 740 is deposited on the sample, resulting in areas that are covered by the second material 740, i.e. the surfaces 720.2 of the sample, and areas that are covered by both the first material 730 and the second material 740, i.e. areas 710.1. With respect to the second deposition step as illustrated, it is noted that this step need not be a selective step, i.e. the material as deposited (i.e. material 740) may be deposited on the entire sample. This may provide in an increased flexibility with respect to the material choice for this material 740. It can be noted however that the second deposition step may also be a selective deposition step, e.g. a material based selective deposition step, whereby the material 740 is e.g. only deposited on the areas or surfaces 720.2 of the sample. In such case, the selectivity may e.g. have been caused by the deposition of the first material 730, e.g. due to the fact that the second material 740 does not adhere well to the first material.

After the second deposition step, a removal step is applied, whereby the first material 730 is removed. This removal step may also be referred to as a washing step, whereby the first material 730, and the material 740 that may be adhered to it, is removed or washed away. The result of such a removal or washing step is schematically shown in portion (d) of FIG. 7. As a result, a structure or sample is obtained whereby selective areas or surfaces are obtained, in particular areas or surfaces 720.2, that are covered by the material 740.

In an embodiment of the present invention, the material that is selectively deposited, either by the one step process or by the two deposition steps process is characterized as an electrical conductor. By doing so, a conducting layer is selectively deposited only on selected areas or substrates of the sample, in particular on areas or surfaces that are of interest for the subsequent inspection step. Suitable material to be selectively deposited may e.g. include copper or cobalt.

As a result, the selected areas or surfaces will have an improved or enhanced visibility when inspected using an electron beam inspection tool. As already indicated, the deposition of the material can e.g. be done with a CVD tool, a PVD (physical vapor deposition) tool or an ALD (atomic layer deposition) tool. It is worth mentioning that the application of an ALD tool may provide in an advantage in that by means of ALD, a better quality of the deposited layer can be obtained than for the other mentioned techniques. The application of ALD also provides in an accurate thickness control of the deposited atomic layer.

With respect to the application on or more selective deposition steps, it can be mentioned that the selectivity as provided in such steps is in general caused by chemical properties of the precursors and materials used, whereby precursor is generally used to describe a material that reacts or decomposes on the surface of the sample to generate the desired deposition.

As a result of the selective deposition, in a next inspection step, e.g. performed by an inspection tool as provided in an inspection system according to the present invention, e.g. an e-beam inspection tool such as a SEM, only selected areas (which are e.g. covered by a conductive material) will be visible or enhanced. This should allow to increase the contrast of the measurement and enable better process control. In an embodiment, the deposited molecules can be removed afterwards e.g. in a material removal unit or washing unit. In an embodiment of the present invention, the deposited materials, applied to enhance, improve or facilitate the subsequent inspection of the substrate or sample are removed in a non-destructive manner, thus enabling the further processing of the substrate or sample.

As an example, a selective deposition process and an subsequent inspection process may be applied to the sample, e.g. a substrate, while still provided with resist, either developed, or partially developed (i.e. baked but not washed out), subsequently the resist may be removed together with the selectively applied material and the sample may be sent for rework by another tool or multiple other tools, e.g. a tool depositing a new resist layer and a lithographic apparatus for performing an new exposure process.

In an embodiment of the inspection method according to the present invention, the selective deposition step is thus followed by an inspection step, e.g. performed by an electron beam inspection tool that is arranged in the same enclosure as the selective deposition tool.

By doing so, any disturbances, e.g. thermal, chemical or mechanical disturbances, that could occur during the transport of a sample of a stand-alone selective deposition tool to a stand-alone electron beam inspection tool can be avoided or mitigated.

The inspection system according to the present invention may advantageously be applied to evaluate the performances of apparatuses involved in the manufacturing of semiconductor devices, such as lithographic apparatus. In particular the lithographic processes as performed by such apparatuses may be more easily and accurately be assessed by means of an inspection system according to the present invention.

Below, a selection of particular applications or use cases will be discussed, whereby an inspection system according to the present invention may advantageously be applied.

As a first example, the present invention may advantageously be applied for the inspection of semiconductor structures that are comparatively dense, i.e. whereby structures are arranged comparatively close to each other. Examples of such structures involve lines, holes such as contact holes, cuts or vias, logic devices, that are e.g. spaced apart over only 2-10 nm. Such structures cannot be made visible using optical CD (critical dimension) techniques or, depending on the materials used, a conventional SEM or CD-SEM, due to the low contrast between the applied materials. Such materials may e.g. be Si, SiO2, HfO2, or, for future applications, III-V or II-VI semiconductor materials.

As a second example, the present invention may advantageously be applied for the inspection of structures having a high aspect ratio. In this respect, a high aspect ratio refers to the ratio of the height or depth of a structure compared to its width or horizontal dimension. Examples of structures having a high aspect ratio may e.g. be contact holes or grating structures. High aspect ratio structures are also encountered in 3D NAND devices. The holes or trenches 620 as schematically shown in FIG. 6 may be considered examples of high aspect ratio structures. A relevant parameter to be determined for such structures is the sidewall angle (SWA). It is submitted that the present invention enables to determine more accurately said parameter or other parameters of structures having a high aspect ratio. It may be noted that high aspect ratio structures are typically the result of etching. In this respect, the inspection method as performed using the inspection system according to the present invention may characterize more than only the lithographic exposure step, but rather a combination of different production steps leading to the structure.

Figure 8:
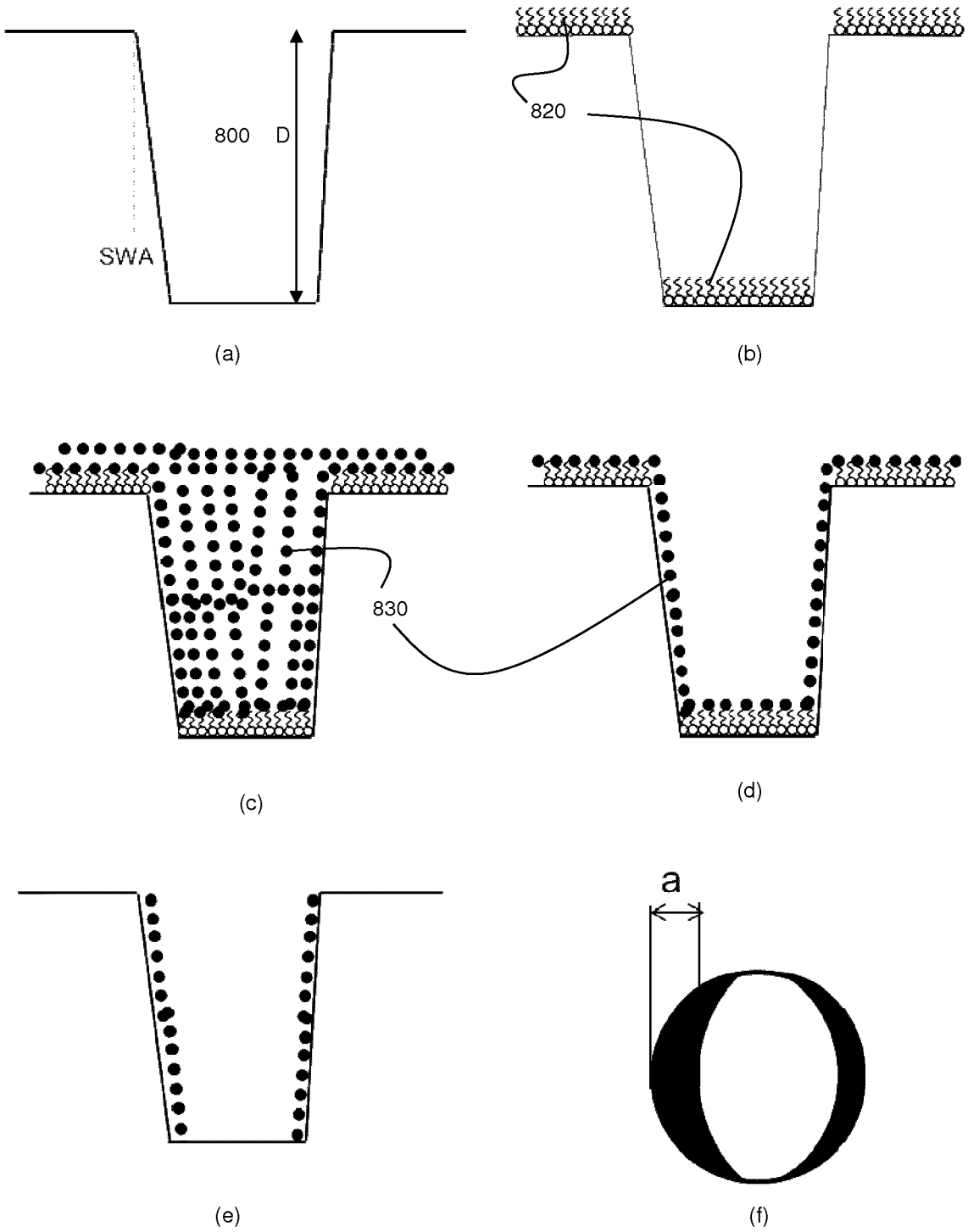

In order to assess such a production process, the selective deposition tool as used in an inspection tool according to the present invention may be configured to selectively deposit a material, e.g. an electrically conductive material onto the side walls or vertical surfaces of the structures. Such a selective deposition process is schematically illustrated in FIG. 8. FIG. 8 (a) schematically shows a structure 800 having a high aspect ratio, i.e. a high height (or depth D) over width ratio, the structure having a non-zero sidewall angle (SWA).

In order to better assess this parameter, the following selective deposition process may be performed.

In first step, illustrated in FIG. 8 (b), a material 820 is selectively deposited on the horizontal surfaces of the structure, i.e. a topography based selective deposition is performed. In order to realize such selectivity, materials are applied that do not adhere to the wall 810 of the structure, because the bonding type of these materials (Van der Waals bonding) is angle-dependent.

In a second step, illustrated in FIG. 8 (c), molecules of a different material 830 are deposited everywhere on the structure, e.g. by means of atomic layer deposition (ALD).

In a third step, the sample or substrate comprising the structure can be purged, thus removing any molecules that do not adhere. The result of this purging is shown in FIG. 8 (d).

In a fourth step, the material 820 is removed or washed away, thereby also removing the material 830 that adheres to it. The result of this washing step is schematically shown in FIG. 8 (e).

Using the process as illustrated, a thin layer of a conductive material 830 can be applied to the sidewalls of structures having a high aspect ratio. When such structures, including the deposited layer, are subsequently inspected, e.g. using an electron beam based inspection tool, an image as schematically shown in FIG. 8 (f) can be obtained, whereby the sidewall surfaces of the structure can be clearly identified.

Based on such an image, in particular the value of the distance "a" as shown, in combination with known other parameters of the structure such as the depth "D", the sidewall angle SWA can be determined.

Figure 9:
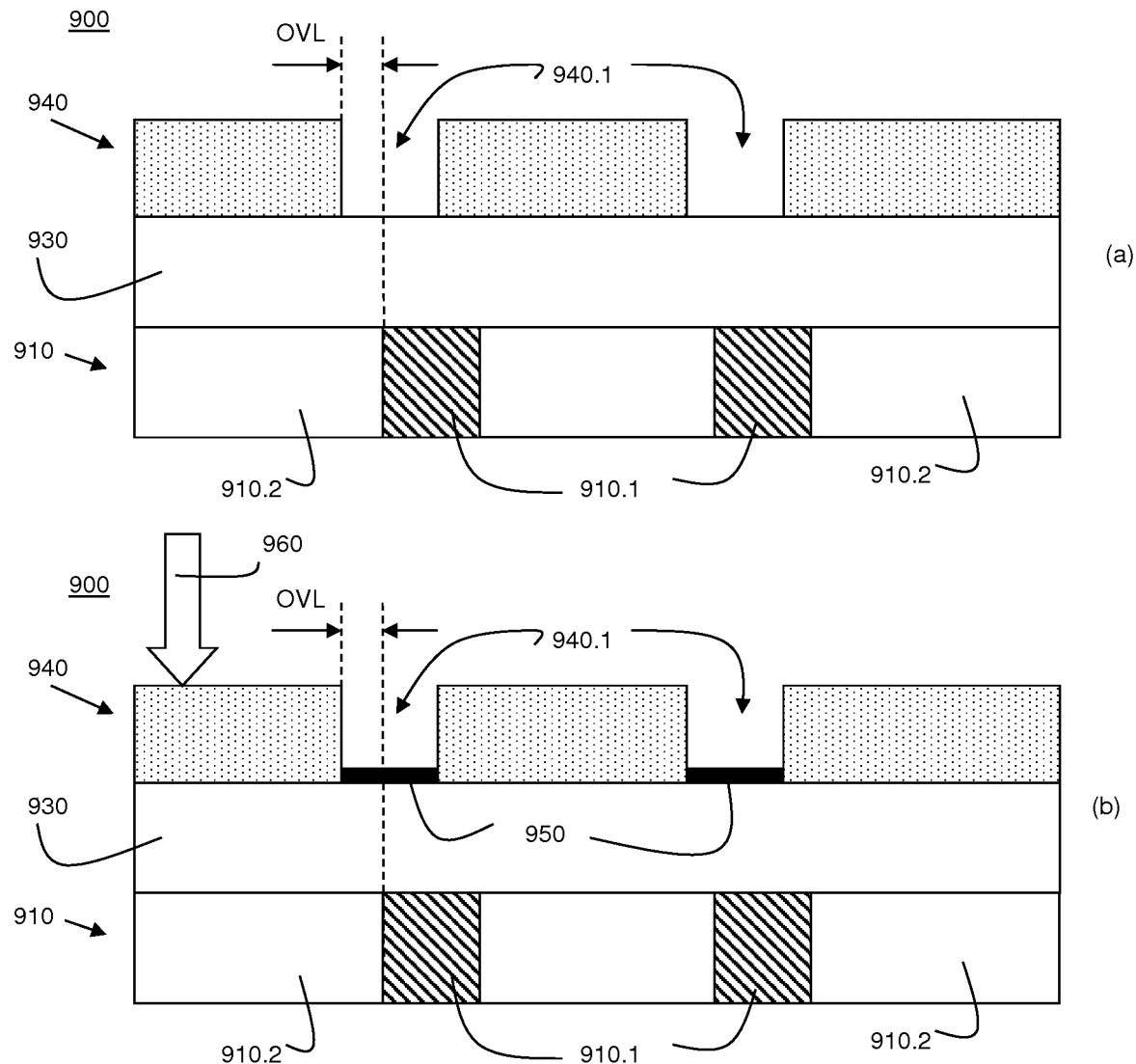
FIGS. 9-10 illustrate the use of the present invention for determining an overlay between two layers of a structure.

As a third example, an assessment of the relevant position of different features or layers of a structure can be examined in more detail or more accurately when an inspection system or inspection method according to the present invention is applied. In particular, by applying the selective deposition step followed by an inspection step as an intermediate step in the manufacturing process of a structure or semiconductor device, enables to determine or check how critical features of the structure or device align. As an example of such an alignment check, the determination of an overlay between a patterned layer on the surface of a structure and a buried layer of the structure can be mentioned. FIG. 9 schematically illustrates how the present invention can enable or facilitate the determination of such an overlay.

FIG. 9 (a) schematically shows a structure 900 comprising a buried layer 910 comprising metal contacts 910.1 alternated with an insulating material 910.2, e.g. a low-k material. The buried layer is covered by a layer 930, the layer 930 is covered by a patterned layer 940, a resist layer. In the embodiment as shown, the resist layer has been exposed or patterned in a lithographic apparatus and the exposed or patterned layer has been developed so as to create through holes or cavities 940.1 in the layer 940. The objective or purpose of this patterned layer with through holes is to etch holes or apertures in the layer 930, in such manner that the holes or apertures would align with the metal contacts 910.1 of the buried layer 910.

It would be advantageous to check whether or not the through holes or cavities 940.1 of the layer 940 are indeed aligned with the metal contacts 910.1, prior to the application of the etching step.

In order to realize this, an embodiment of the present invention provides in subjecting a structure such as structure 900 to a selective deposition step, in particular a material based selective deposition step, whereby a material, e.g. a conductive layer 950 is deposited at the bottom of the through holes 940.1, i.e. onto the layer 930, the layer 930 typically being made of a different material than the resist layer 940. The result of this deposition step is schematically shown in FIG. 9 (b).

When this selective deposition step has been executed, the sample or structure 900 can then be inspected by an inspection tool, e.g. an electron beam based inspection tool as can be applied in an inspection system according to the present invention. in such a tool, the surface of the structure can be scanned by an electron beam 960, resulting in an interaction of the beam 960 with the materials of the structure. As indicated above, the interaction of the electron beam 960 with the structure will typically depend on the energy of the applied electron beam. In the given example shown in FIG. 9 (b), the use of an electron beam having a comparatively low energy will result in the electron beam having an interaction volume (a tear-shaped volume) that primarily interacts with the layers 940 and 930, whereby secondary electrons may be generated due to interaction of this electron beam and the material 950. The use of an electron beam having a comparatively high energy will result in the electron beam having a larger interaction volume (a tear-shaped volume), e.g. an interaction volume that interacts with the layers 940 and 930 and also with the buried layer 910. As a result of such an interaction, secondary electrons may be generated due to interaction of this electron beam and the material 950 and back-scattering electrons may be generated due to the interaction of the electron beam with the metal contacts 910.1. By appropriately selecting the material 950 that is deposited, e.g. a conductive material, the contrast may be enhanced; in particular, the contrast between a signal emitted by the layer 940 and the layer 930 will typically be smaller than the contrast between the layer 940 and the deposited material 950, thus enabling a more accurate assessment of the position of the through holes 940.1. As such, by observing, by the inspection tool of the inspection system according to the present invention, both the generated secondary electrons and the back-scattering electrons, the relative position of the material 950 and the metal contacts 910.1 can be determined, this relative position being indicative for the overlay or alignment OVL of the through holes 940.1 and the metal contacts 910.1. In case this overlay value OVL would be unsatisfactory, one can remove both the material 950 and the resist layer 940 and repeat the exposure process by the lithographic apparatus.

In the embodiment as shown in FIG. 9, it was assumed that the resist layer 940 had been developed such that through holes 940.1 were formed, these through holes extending to the layer 930.

Figure 10:
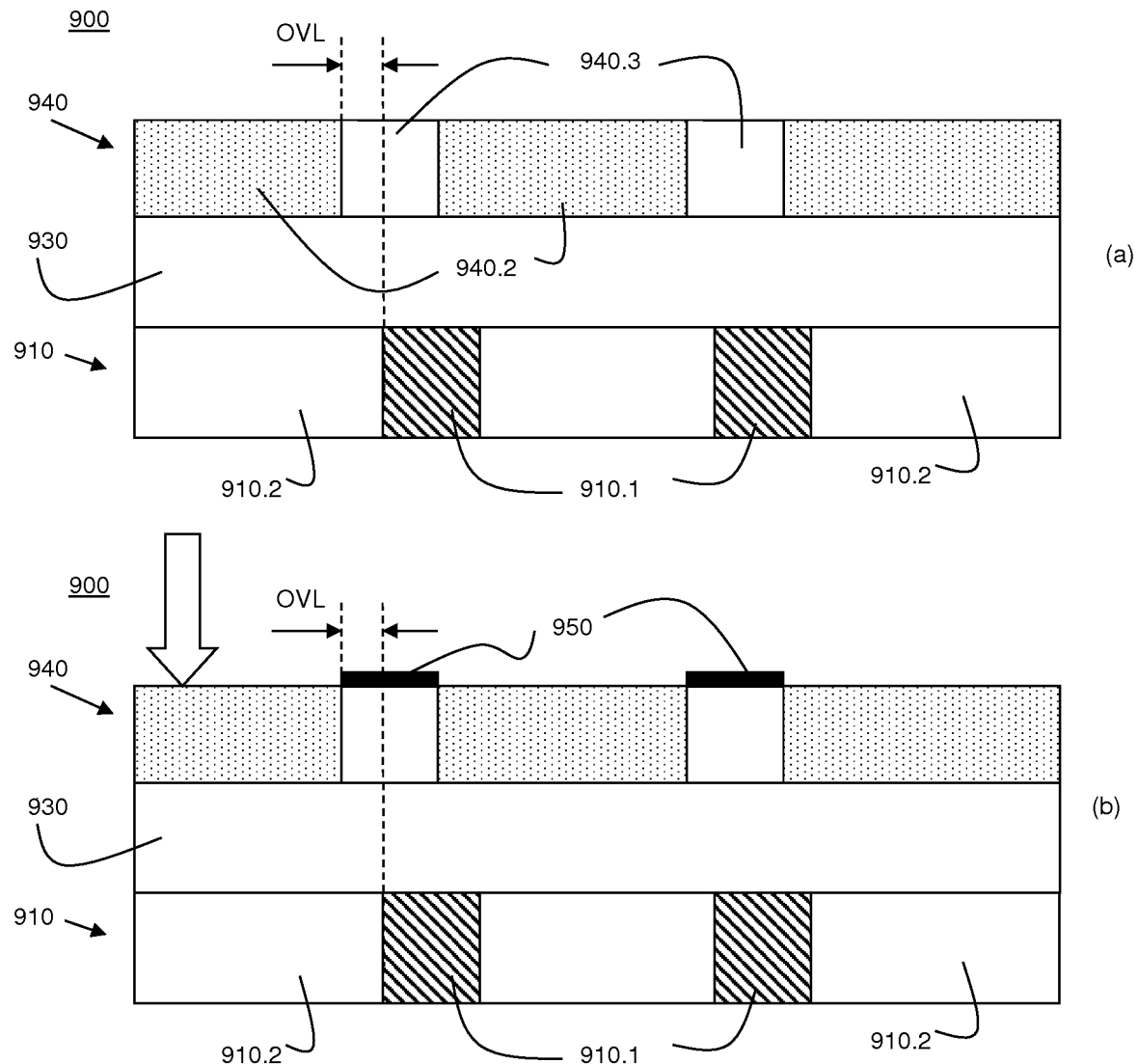

In an embodiment of the present invention, the selective deposition step may be performed before the development step. This is schematically illustrated in FIG. 10. FIG. 10 (a) schematically shows the structure 900 prior to the development step whereby the through holes 940.1 would be formed. Prior to this development step, the resist layer consists of materials 940.2 and 940.3, the difference only being that one has been exposed and the other has not been exposed. This difference in material property or characteristic may advantageously be used to apply a material based selective deposition process, whereby only material 940.3 is covered by a layer of a material 950, e.g. a conductive material. The resulting structure is schematically shown in FIG. 10 (b). In a similar manner as discussed with respect to FIG. 9, an inspection tool such as an electron beam inspection tool as applied in an inspection system according to the present invention, may then be used to determine, based on detected secondary electrons and back-scattering electrons, the relative position or overlay value OVL between the resist layer 940 and the buried layer 910.

As a fourth example, the present invention may facilitate the determination of parameters such as line edge roughness (LER) or line width roughness (LWR) of line shaped structures.

Figure 11:
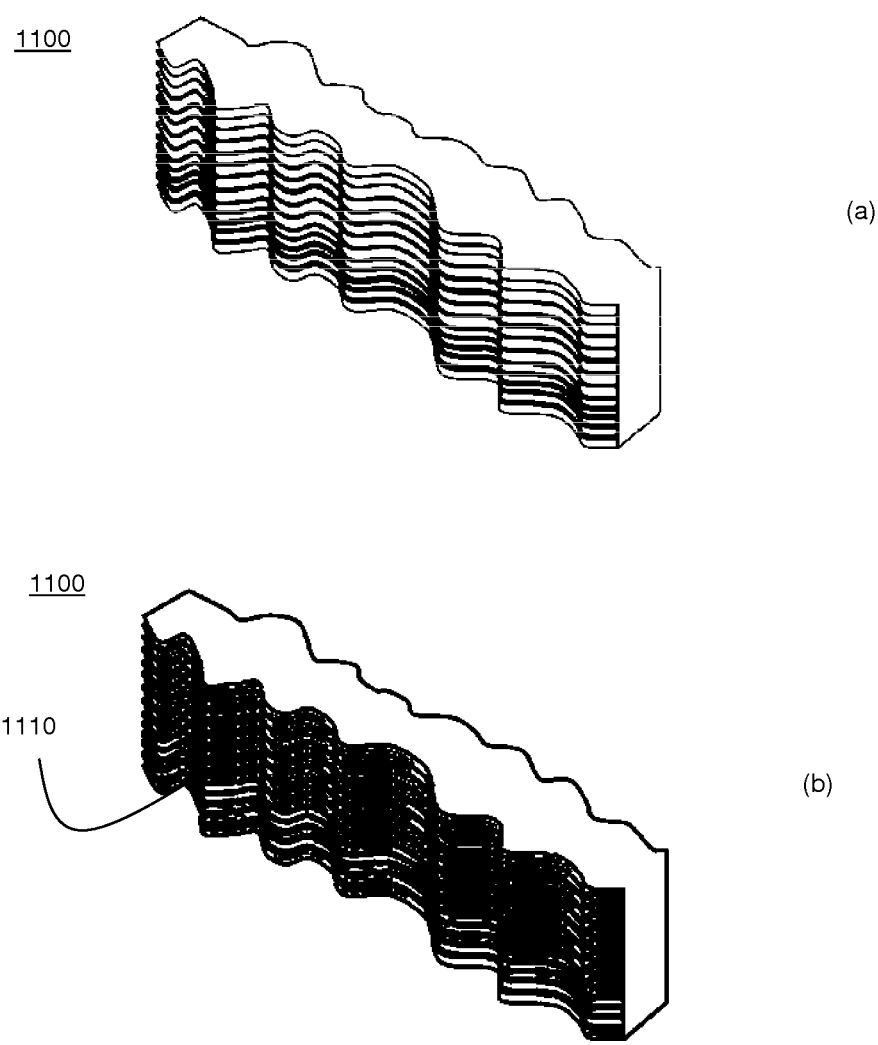
FIG. 11 illustrates the application of a conductive coating on a line shaped structure.

FIG. 11 (a) schematically shows such a 3D view of such a line shaped structure 1100 having an irregular edge and line thickness. Using a convention electron beam inspection tool, these parameters would be difficult to determine, due to the low contrast obtained between the sidewall surface and the top surface of the structure.

In order to better assess these parameters, the selective deposition tool as applied in the inspection system according to the present invention may be configured to selectively deposit a conductive layer 1110 on the side surface of the structure (see FIG. 11(b)), such a conductive layer e.g. comprising Pt, Ti, Cu, Ni, or Cr. By doing so, the detected signal from the sidewall will be enhanced, thus enabling a better determination of the LER or LWR parameters.

Alternatively, the selective deposition tool as applied in the inspection system according to the present invention may be configured to selectively deposit a layer on the top surface and the bottom surface of the structure. An inspection tool as applied in the inspection system according to the present invention, e.g. a SEM, may then be used to image the top and bottom surfaces. Based on such image, the LER and/or LWR parameters may be determined.

As will be understood by the skilled person, the present invention, either the inspection system or the inspection method according to the present invention may advantageously be applied in other circumstances or use-cases as well.

Figure 12:
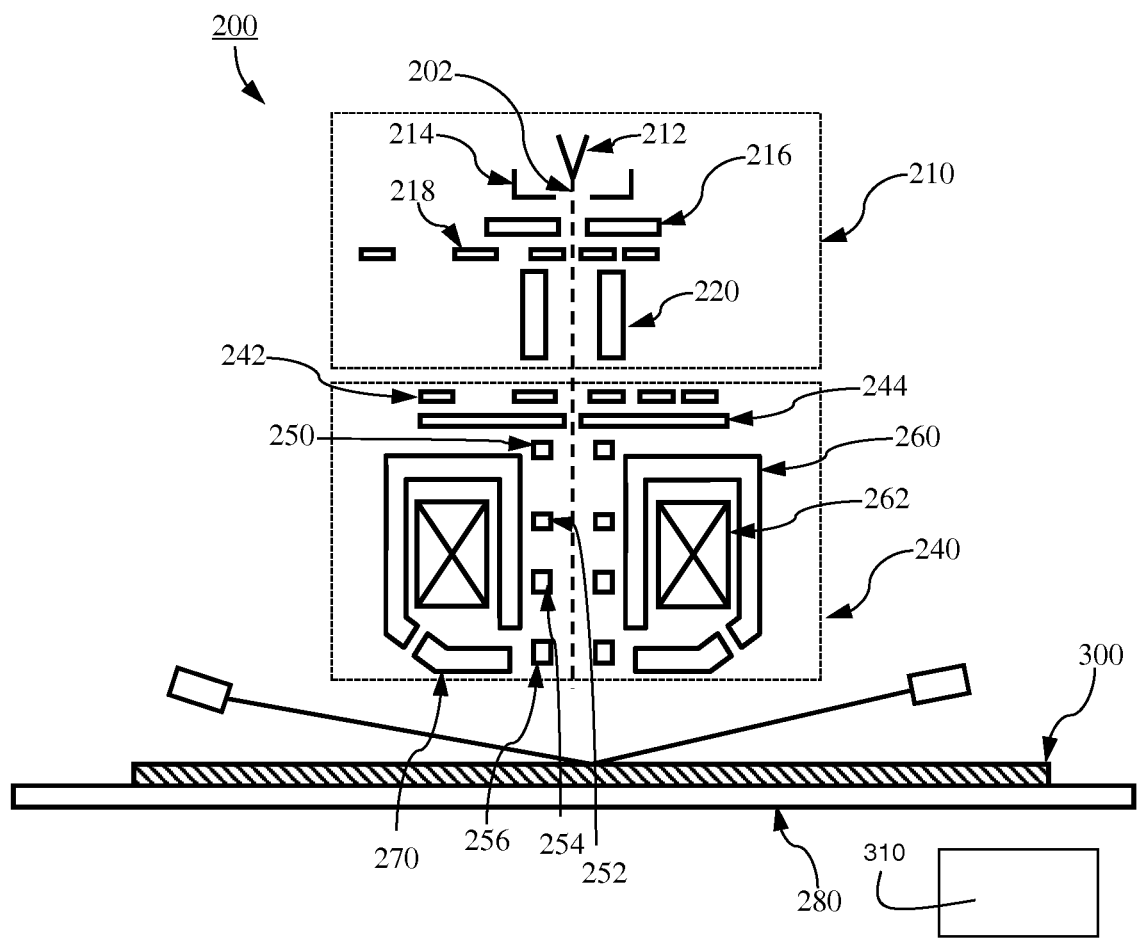
FIG. 12 schematically depicts a more detailed embodiment of an inspection tool according to the present invention.

FIG. 12 schematically depicts a more detailed embodiment of an inspection tool 200 as can be applied in an inspection system according to the present invention, which can be configured to perform the inspection method according to the present invention. The inspection tool 200 comprises an e-beam source, referred to as the electron gun 210 and an imaging system 240.

The electron gun 210 comprises an electron source 212, a suppressor electrode 214, an anode 216, a set of apertures 218, and a condenser 220. The electron source 212 can be a Schottky emitter or modified Schottky emitter as discussed above. By the positive charge of the anode 216, the electron beam 202 can be extracted, and the electron beam 202 may be controlled by using a tunable aperture 218 which may have different aperture sizes for eliminating the unnecessary electron beam outside of the aperture. In order to condense the electron beam 202, the condenser 220 is applied to the electron beam 202, which also provides magnification. The condenser 220 shown in the FIG. 12 may e.g. be an electrostatic lens which can condense the electron beam 202. On the other hand, the condenser 220 can be also a magnetic lens.

The imaging system 240 may e.g. comprise a blanker, a set of apertures 242, a detector 244, four sets of deflectors 250, 252, 254, and 256, a pair of coils 262, a yoke 260, and an electrode 270. The electrode 270 may be used to retard and deflect the electron beam 202, and may further have an electrostatic lens function. Besides, the coil 262 and the yoke 260 may be configured to the magnetic objective lens.

The deflectors 250 and 256 can be applied to scan the electron beam 202 to a large field of view, and the deflectors 252 and 254 can be used for scanning the electron beam 202 to a small field of view. All the deflectors 250, 252, 254, and 256 can control the scanning direction of the electron beam 202. The deflectors 250, 252, 254, and 256 can be electrostatic deflectors or magnetic deflectors. The opening of the yoke 260 is faced to the sample 300, which immerses the magnetic field into the sample 300. On the other hand, the electrode 270 is placed beneath the opening of the yoke 260, and therefore the sample 300 will not be damaged. In order to correct a chromatic aberration of the electron beam 202, the retarder 270, the sample 300, and the yoke 260 or part thereof may form a lens to eliminate the chromatic aberration of the electron beam 202. The inspection tool 200 further comprises a processing unit 310, which can e.g. be embodied as a processor, microprocessor, controller, or computer, the processing unit 310 being configured to receive a response signal from the detector or detectors, e.g. detector 244, of the inspection tool and process the response signal into an image of the scanned or examined structure or sample 300.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The inspection system according to the present invention may advantageously be applied in control loops of not only lithographic apparatuses but also etching tools, deposition chambers and other tools used in IC manufacturing.

The embodiments may further be described using the following clauses:

1. Inspection system comprising:
   a selective deposition tool configured to:
   receive a sample;
   selectively deposit a material onto the sample;
   an inspection tool configured to:
   perform an inspection process on the sample provided with the deposited material,
   an enclosure configured to enclose the selective deposition tool and the inspection tool.
2. The inspection system according to clause 1, wherein the selective deposition tool is arranged inside a first chamber of the enclosure, wherein the inspection tool is arranged inside a second chamber of the enclosure, the inspection system further comprising a sample transfer system for transferring the sample from a location within the first chamber to a location within the second chamber.
3. The inspection system according to clause 2, further comprising a load lock interfacing between the first chamber and the second chamber.
4. The inspection system according to any of the preceding clauses, wherein the enclosure comprises a port for inputting and outputting the sample and a handling system for handling the sample inside the enclosure.
5. The inspection system according to clause 4, further comprising a load lock interfacing between the port and the first chamber and/or a load lock interfacing between the port and the second chamber.
6. The inspection system according to any of the preceding clauses, wherein the selective deposition tool comprises an atomic layer deposition tool and/or a physical vapor deposition tool and/or a chemical vapor deposition tool.
7. The inspection system according to clause 6, wherein the atomic layer deposition tool comprises a washing unit.
8. The inspection system according to clause 7, wherein the atomic layer deposition tool, the washing tool and the inspection tool are arranged in-line.
9. The inspection system according to any of the preceding clauses, wherein the inspection tool comprises an electron beam inspection tool such as a SEM, LEEM or SPLEEM.
10. The inspection system according to any of the preceding clauses, wherein the inspection system is configured to maintain a conditioned atmosphere inside the enclosure.
11. The inspection system according to any of the preceding clauses, wherein the selective deposition tool and the inspection tool are mounted to a common base frame.
12. The inspection system according to any of the preceding clauses, wherein the inspection tool comprises:
    an e-beam source configured to generate an electron beam for probing a sample;
    a detector configured to detect a response signal from the sample.
13. The inspection system according to any of the preceding clauses, wherein the inspection system further comprises a conditioning tool for conditioning the sample.
14. The inspection system according to any of the preceding clauses, wherein the selective deposition tool is configured to selectively deposited the material onto the sample, based on a material characteristic and/or a topography of the sample.
15. Inspection method using an inspection system according to any of the preceding clauses, the method comprising:
    receiving a sample by the inspection system;
    selectively depositing a material onto the sample using the selective deposition tool;
    inspecting the sample onto which the material is deposited using the inspection tool.
16. The inspection method according to clause 15, further comprising the step of:
    removing the deposited material after inspecting the sample.
17. The inspection method according to clause 16, further comprising the step of:
    reworking the sample after removing the deposited material.
18. The inspection method according to any of the clauses 15 to 17, wherein the sample comprises a structure having a high aspect ratio and wherein the step of selectively depositing a material onto the sample comprises selectively depositing a conductive material on a sidewall of the structure having the high aspect ratio.
19. The method according to clause 18, wherein the step of inspection the sample comprises determining a sidewall angle, a line edge roughness or a line width roughness of the structure having the high aspect ratio.
20. The inspection method according to clause 15, wherein the sample comprises a patterned and/or developed resist layer and a buried layer having a structure underneath the patterned and/or developed resist layer and wherein the step of selectively depositing a material onto the sample comprises selectively depositing the material on the patterned and/or developed resist layer and wherein the step of inspecting the sample comprises determining an overlay between the patterned and/or developed resist layer and the buried layer.
21. The inspection method according to clause 20, wherein the material comprises a dense or a conductive material.
22. A lithographic system comprising a lithographic apparatus and an inspection system according to any of the clauses 1 to 14.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An inspection system comprising:
   a selective deposition tool configured to:
     receive a sample comprising a substrate, and
     selectively deposit a material onto the sample such that, for an area of the sample exposed to the material being deposited, a first surface, within the area, of the substrate or of one or more layers on the substrate has material deposited onto that first surface and a second surface, within the area, of the substrate or of one or more layers on the substrate does not have material deposited onto that second surface so that contrast or visibility of the first and/or second surface is improved for an inspection process performed directly on the first and second surfaces, and such that a surface of the deposited material overlies the first surface and the first surface and the second surface together form an essentially planar surface or the deposited material has at least two essentially planar surface portions, a first portion of the at least two portions is opposite to the first surface and at a different height than a second portion of the at least two portions;
   an inspection tool configured to perform the inspection process directly on the first and second surfaces of the sample; and
   an enclosure configured to enclose the selective deposition tool and the inspection tool.

2. The inspection system according to claim 1, wherein the selective deposition tool is arranged inside a first chamber of the enclosure, wherein the inspection tool is arranged inside a second chamber of the enclosure, and wherein the inspection system further comprises a sample transfer system configured to transfer the sample from a location within the first chamber to a location within the second chamber.

3. The inspection system according to claim 2, further comprising a load lock interfacing between the first chamber and the second chamber.

4. The inspection system according to claim 1, wherein the enclosure comprises a port configured to input and output the sample and a handling system configured to handle the sample inside the enclosure.

5. The inspection system according to claim 4, further comprising a load lock interfacing between the port and the first chamber and/or a load lock interfacing between the port and the second chamber.

6. The inspection system according to claim 1, wherein the selective deposition tool comprises an atomic layer deposition tool and/or a physical vapor deposition tool and/or a chemical vapor deposition tool.

7. The inspection system according to claim 6, wherein the selective deposition tool comprises an atomic layer deposition tool and wherein the atomic layer deposition tool comprises a washing unit.

8. The inspection system according to claim 7, wherein the atomic layer deposition tool, the washing tool and the inspection tool are arranged in-line.

9. The inspection system according to claim 1, wherein the inspection tool comprises an electron beam inspection tool.

10. The inspection system according to claim 1, configured to maintain a conditioned atmosphere inside the enclosure.

11. The inspection system according to claim 1, wherein the selective deposition tool and the inspection tool are mounted to a common base frame.

12. The inspection system according to claim 1, wherein the inspection tool comprises:
    an e-beam source configured to generate an electron beam for probing a sample; and
    a detector configured to detect a response signal from the sample.

13. The inspection system according to claim 1, further comprising a conditioning tool configured to condition the sample.

14. The inspection system according to claim 1, wherein the selective deposition tool is configured to selectively deposit the material onto the sample, based on a material characteristic and/or a topography of the sample.

15. An inspection method comprising:
    receiving a sample comprising a substrate by an inspection system comprising:
      a selective deposition tool to selectively deposit a material onto the sample,
      an inspection tool to perform an inspection process on the sample, and
      an enclosure enclosing the selective deposition and inspection tools;
    selectively depositing a material onto the sample using the selective deposition tool such that, for an area of the sample exposed to the material being deposited, a first surface, within the area, of the substrate or of one or more layers on the substrate has material deposited onto that first surface and a second surface, within the area, of the substrate or of one or more layers on the substrate does not have material deposited onto that second surface so that contrast or visibility of the first and/or second surface is improved for the inspection tool, wherein a surface of the deposited material overlies the first surface and the first surface and the second surface together form an essentially planar surface or wherein the deposited material has at least two essentially planar surface portions, a first portion of the at least two portions is opposite to the first surface and at a different height than a second portion of the at least two portions; and
    inspecting directly on the first and second surfaces of the sample onto which the material is deposited, using the inspection tool.

16. The method according to claim 15, wherein the selective deposition tool is arranged inside a first chamber of the enclosure, wherein the inspection tool is arranged inside a second chamber of the enclosure, and further comprising transferring the sample from a location within the first chamber to a location within the second chamber using a sample transfer system of the inspection system.

17. The method according to claim 15, wherein the inspection tool comprises an electron beam inspection tool.

18. The method according to claim 15, wherein the selective deposition tool comprises an atomic layer deposition tool and/or a physical vapor deposition tool and/or a chemical vapor deposition tool.

19. The method according to claim 15, further comprising conditioning the sample using a conditioning tool of the inspection system.

20. The method according to claim 15, comprising selectively depositing the material onto the sample, based on a material characteristic and/or a topography of the sample.

\* \* \* \* \*

UNITED STATES PATENT AND TRADEMARK OFFICE
CERTIFICATE OF CORRECTION

PATENT NO. : 12,313,980 B2  
APPLICATION NO. : 16/977503  
DATED : May 27, 2025  
INVENTOR(S) : Alexey Olegovich Polyakov et al.

Page 1 of 1

It is certified that error appears in the above-identified patent and that said Letters Patent is hereby corrected as shown below:

On the Title Page

Item (72) Inventors:
Please correct "Erwin Paul Smakman, Veldhoven (NL), Andrey Nikipelov, Veldhoven (NL), Albertus Victor Gerardus Mangnus, Veldhoven (NL)" to "Erwin Paul Smakman, Eindhoven (NL), Andrey Nikipelov, Eindhoven (NL), Albertus Victor Gerardus Mangnus, Eindhoven (NL)".

Signed and Sealed this  
Fifteenth Day of July, 2025

Coke Morgan Stewart  
*Acting Director of the United States Patent and Trademark Office*